United States Patent
Suzuki et al.

(10) Patent No.: US 8,951,640 B2
(45) Date of Patent: Feb. 10, 2015

(54) COVERED MEMBER AND PROCESS FOR PRODUCTION THEREOF

(75) Inventors: Masahiro Suzuki, Kashiba (JP);
Toshiyuki Saito, Kashiba (JP);
Kazuyoshi Yamakawa, Nishinomiya (JP)

(73) Assignee: JTEKT Corporation, Osaka (JP)

( * ) Notice: Subject to any disclaimer, the term of this patent is extended or adjusted under 35 U.S.C. 154(b) by 101 days.

(21) Appl. No.: 13/635,480

(22) PCT Filed: Apr. 8, 2011

(86) PCT No.: PCT/JP2011/058910
§ 371 (c)(1),
(2), (4) Date: Sep. 17, 2012

(87) PCT Pub. No.: WO2011/152122
PCT Pub. Date: Dec. 8, 2011

(65) Prior Publication Data
US 2013/0017412 A1 Jan. 17, 2013

(30) Foreign Application Priority Data

May 31, 2010 (JP) .................................. 2010-124553

(51) Int. Cl.
*C23C 16/00* (2006.01)
*C23C 16/26* (2006.01)
*C23C 16/02* (2006.01)
*C23C 16/515* (2006.01)
*C23C 28/04* (2006.01)

(52) U.S. Cl.
CPC .............. *C23C 16/26* (2013.01); *C23C 16/0263* (2013.01); *C23C 16/0272* (2013.01); *C23C 16/515* (2013.01); *C23C 28/046* (2013.01); *C23C 28/048* (2013.01)

USPC ........ 428/408; 427/348; 427/419.1; 427/577; 428/156

(58) Field of Classification Search
CPC C23C 16/0263; C23C 16/0272; C23C 16/26; C23C 16/515; C23C 28/00
USPC ................ 427/348, 419.1, 577; 428/156, 408
See application file for complete search history.

(56) References Cited

U.S. PATENT DOCUMENTS 6,214,479 B1 4/2001 Mori et al.
6,656,591 B2 * 12/2003 Liu et al. ...................... 428/408
(Continued)

FOREIGN PATENT DOCUMENTS

CA 2061944 9/1992
EP 0 503 822 A2 9/1992
(Continued)

OTHER PUBLICATIONS

Mao et al., "Enhanced electron field emission properties of diamond-like carbon films using a titanium intermediate layer," *Journal of Physics D. Applied Physics*, 1999, pp. 1570-1577, vol. 32, No. 14.
(Continued)

*Primary Examiner* — Archene Turner
(74) *Attorney, Agent, or Firm* — Oliff PLC (57) ABSTRACT

Disclosed is a covered member including a base material, a first intermediate layer that has a roughened surface and covers the base material, and a DLC film that covers the surface of the first intermediate layer. The first intermediate layer and the DLC film are formed in a state where the temperature of the base material is kept at 300° C. or lower. The surface of the first intermediate layer is roughened by collision of ions.

6 Claims, 3 Drawing Sheets

(56) References Cited

U.S. PATENT DOCUMENTS

| | | | |
|---|---|---|---|
| 8,123,227 B2* | 2/2012 | Kawanishi et al. | 428/408 |
| 2006/0147631 A1* | 7/2006 | Lev et al. | 427/290 |
| 2006/0196419 A1 | 9/2006 | Tudhope et al. | |
| 2008/0171154 A1* | 7/2008 | Maushart et al. | 427/577 |
| 2011/0088848 A1 | 4/2011 | Kim et al. | |
| 2011/0195265 A1 | 8/2011 | Oohira et al. | |

FOREIGN PATENT DOCUMENTS

| | | |
|---|---|---|
| JP | A-5-148068 | 6/1993 |
| JP | 11-310868 | * 11/1999 |
| JP | A-2002-36791 | 2/2002 |
| JP | A-2004-204311 | 7/2004 |
| JP | A-2007-314838 | 12/2007 |
| JP | A-2008-045180 | 2/2008 |
| JP | A-2009-245593 | 10/2009 |
| WO | WO 2010/050542 A1 | 5/2010 |

OTHER PUBLICATIONS

Jan. 3, 2014 Extended European Search Report issued in European Patent Application No. 11789532.6.

International Search Report issued in International Patent Application No. PCT/JP2011/058910 dated Jul. 19, 2011.

* cited by examiner

FIG. 4 ial is narrowed. Therefore, in order to improve the adhesiveness of the DLC film to the base material while securing a wide range of choice of the material as the base material, an appropriate intermediate layer must be formed between the base material and the DLC film.

COVERED MEMBER AND PROCESS FOR PRODUCTION THEREOF

TECHNICAL FIELD

The present invention relates to a covered member having a base material at least a portion of which is covered by a DLC film, and a process for production thereof.

BACKGROUND ART

For example, to reduce fuel consumption of an automobile, it has been demanded to reduce the sliding resistances of various sliding members installed in the automobile. Therefore, in some cases, at least a portion of the surface of the base material of the sliding member is covered by a DLC (Diamond-Like Carbon) film with low frictional properties and high wear resistance (high hardness) (for example, refer to Patent Document 1).

The DLC film is formed by, for example, a DC plasma CVD (Plasma Chemical Vapor Deposition) method using application of a DC voltage to the base material or DC pulse plasma CVD method using application of a DC pulse voltage to the base material.

Specifically, the inside of the treatment chamber that houses the base material is vacuum evacuated, and while keeping a predetermined treatment pressure inside the treatment chamber by continuously introducing a material gas including a carbon-based compound such as methane, hydrogen gas, and argon gas, etc., plasma is generated inside the treatment chamber by applying a DC voltage or a DC pulse voltage to the base material. Accordingly, ions and radicals are produced from the material gas, and chemical reaction occurs on the surface of the base material, and a film (DLC film) containing C (carbon) as a main component accumulates on the surface of the base material.

PRIOR ART DOCUMENT

Patent Document

Patent Document 1: Japanese Published Unexamined Patent Application No. 2004-204311

SUMMARY OF THE INVENTION

Problem to be Solved by the Invention

The adhesiveness of the DLC film to the base material is weak. Therefore, it has been desired to improve the adhesiveness of the DLC film to the base material. To improve the adhesiveness of the DLC film, for example, an intermediate layer is formed between the base material and the DLC film, or a nitrided layer or a carburized layer is formed on the surface layer of the base material by performing nitriding or carburizing (for example, plasma nitriding or plasma carburizing) before the DLC film is formed.

However, even when an intermediate layer is formed between the base material and the DLC film, if the intermediate layer is not appropriate, high adhesiveness cannot be obtained. To form a nitrified layer or a carburized layer sufficient for obtaining high adhesiveness, nitriding or carburizing must be performed in an environment at a high temperature. Therefore, the range of choice of the material as the base material is narrowed. Therefore, in order to improve the adhesiveness of the DLC film to the base material while securing a wide range of choice of the material as the base material, an appropriate intermediate layer must be formed between the base material and the DLC film.

Therefore, an object of the present invention is to provide a covered member that has a DLC film having high adhesiveness to the base material, and widens the range of choice of the material as the base material, and a process for production of the covered member.

Means for Solving the Problem

An aspect of the present invention provides a process for production of a covered member (19) having a base material (4) at least a portion of which is covered by a DLC film (22), including a first intermediate layer formation step which forms a first intermediate layer (20) that covers the surface (4a) of the base material while keeping the temperature of the base material at 300° C. or lower, a roughening step which roughens the surface (20a) of the first intermediate layer by making ions collide with the surface of the first intermediate layer while keeping the temperature of the base material at 300° C. or lower, and a DLC film formation step which forms a DLC film that covers the roughened surface of the first intermediate layer while keeping the temperature of the base material at 300° C. or lower (claim 1).

According to this method, by collision of ions, fine unevenness (unevenness in atom sizes) is formed on the surface of the first intermediate layer. Accordingly, the contact area between the first intermediate layer and the DLC film is increased, and the adhesiveness of the DLC film to the first intermediate layer is increased. In addition, the DLC film partially enters the concave portions formed on the surface of the first intermediate layer, so that by the anchor effect thereof, the adhesiveness of the DLC film to the first intermediate layer is further increased. Specifically, the portions entering the concave portions of the DLC film serve like nails and wedges, so that the adhesiveness of the DLC film to the first intermediate layer is further increased. Accordingly, the adhesiveness of the DLC film to the base material is increased. The first intermediate layer formation step, the roughening step, and the DLC film formation step are performed in a state where the temperature of the base material is kept at 300° C. or lower, so that the damage of the base material by an increase in temperature is small. Therefore, the range of choice of the material as the base material is wide.

The process for production of the covered member may further include a pretreatment step which roughens the surface of the base material by making ions collide with the surface of the base material while keeping the temperature of the base material at 300° C. or lower before the first intermediate layer is formed (claim 2).

In this case, by collision of ions, fine unevenness (unevenness in atom sizes) is formed on the surface of the base material. Accordingly, the contact area between the base material and the first intermediate layer is increased, and the adhesiveness of the first intermediate layer to the base material is increased. The first intermediate layer partially enters the concave portions formed on the surface of the base material, so that by the anchor effect thereof, the adhesiveness of the first intermediate layer to the base material is further increased. Accordingly, the adhesiveness of the DLC film to the base material is increased.

The process for production of the covered member may further include a second intermediate layer formation step which forms a second intermediate layer (21) that covers the surface of the first intermediate layer while keeping the temperature of the base material at 300° C. or lower before the DLC film is formed, and the DLC film formation step may include a step of forming a DLC film that covers the surface (21a) of the second intermediate layer while keeping the temperature of the base material at 300° C. or lower (claim 3).

In this case, the surface of the first intermediate layer is covered by the second intermediate layer. Therefore, even when in the roughening step, ions penetrate through the first intermediate layer and a portion of the surface of the base material is exposed from the first intermediate layer, this exposed portion can be covered by the second intermediate layer. Accordingly, the DLC film can be prevented from directly accumulating on the surface of the base material. Accordingly, the DLC film is prevented from being deteriorated in adhesiveness to the base material.

Another aspect of the present invention provides a covered member having a base material at least a portion of which is covered by a DLC film, including a base material, a first intermediate layer that has a roughened surface and covers the base material, and a DLC film that covers the surface of the first intermediate layer, wherein the first intermediate layer and the DLC film are formed in a state where the temperature of the base material is kept at 300° C. or lower, and the surface of the first intermediate layer is roughened by collision of ions (claim 4). With this configuration, the same effect as described above can be obtained.

The base material may have a surface that is roughened by collision of ions and covered by the first intermediate layer (claim 5). In this case, the same effect as described above can be obtained.

The covered member may further include a second intermediate layer that has a surface covered by the DLC film, and covers the surface of the first intermediate layer (claim 6). In this case, the same effect as described above can be obtained.

The foregoing and other objects, features, and effects of the present invention are clarified by the following description of a preferred embodiment with reference to the accompanying drawings.

BEST MODE FOR CARRYING OUT THE INVENTION

Figure 1:
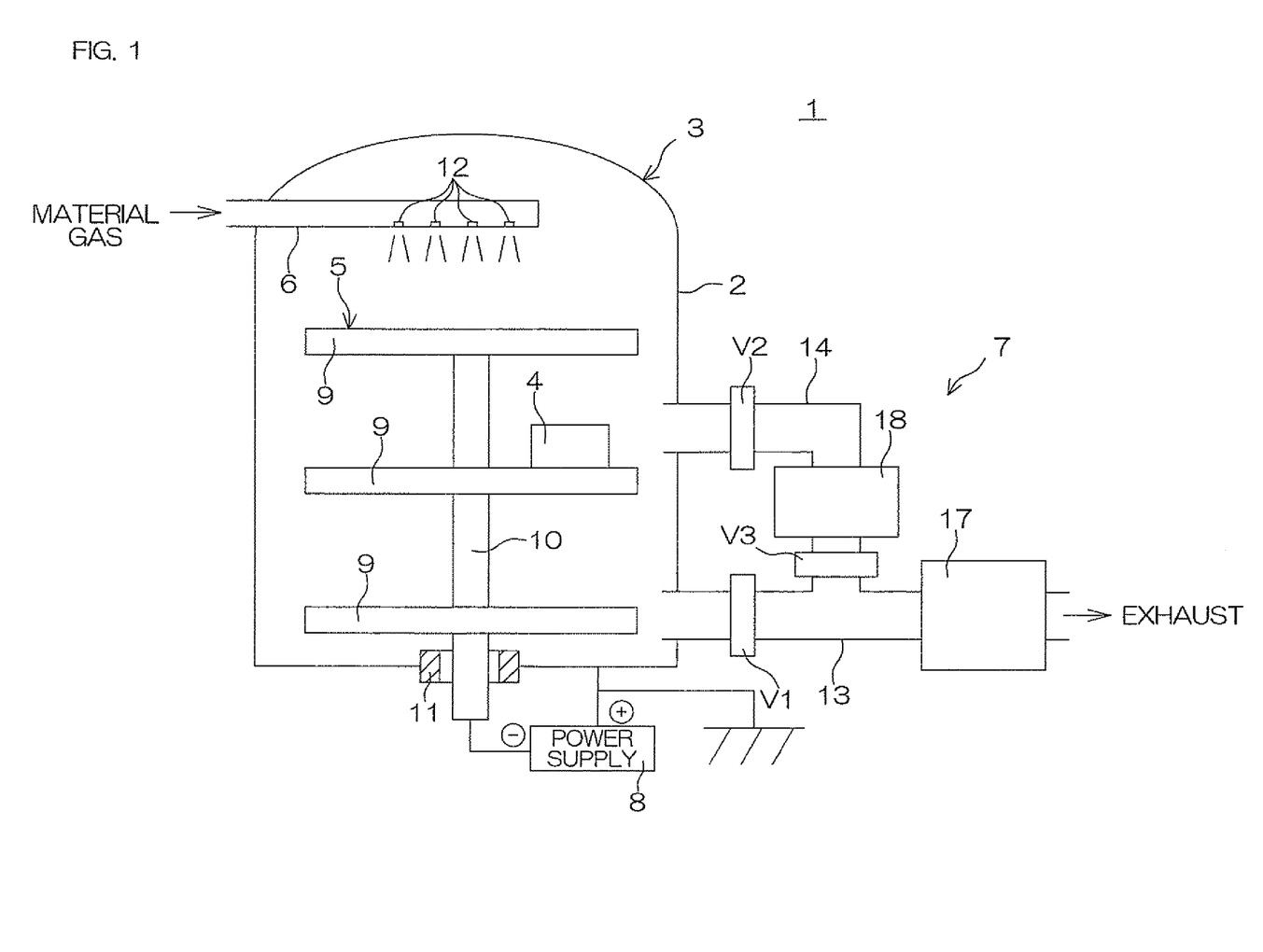
FIG. 1 is a schematic sectional view showing a configuration of a plasma CVD apparatus that is used in a process for production of a covered member according to a preferred embodiment of the present invention.

FIG. 1 is a schematic sectional view showing a configuration of a plasma CVD apparatus 1 to be used in a process for production of a covered member according to a preferred embodiment of the present invention.

The plasma CVD apparatus 1 includes a treatment chamber 3 surrounded by a confining wall 2, a platform base 5 that holds a base material 4 inside the treatment chamber 3, a material gas introduction tube 6 for introducing a material gas into the treatment chamber 3, an exhaust system 7 for vacuum evacuating from the inside of the treatment chamber 3, and a power supply 8 that generates a DC pulse voltage for converting the gas introduced into the treatment chamber 3 into plasma.

The platform base 5 includes support plates 9 held at horizontal postures and a support shaft 10 that extends in the vertical direction and supports the support plates 9. In this embodiment, as the platform base 5, for example, a three-stage type including three support plates 9 arranged in the up-down direction is adopted. The platform base 5 is made of a conductive material such as iron and steel as a whole. The negative terminal of the power supply 8 is connected to the platform base 5. The base material 4 is placed on the support plate 9.

The confining wall 2 of the treatment chamber 3 is made of a conductive material such as stainless steel. To the confining wall 2, the positive terminal of the power supply 8 is connected. The confining wall 2 is connected to the ground. The confining wall 2 and the platform base 5 are insulated by an insulating member 11. Therefore, the confining wall 2 is kept at the ground potential. When the power supply 8 is turned on and a DC pulse voltage is generated, a potential difference occurs between the confining wall 2 and the platform base 5.

The material gas introduction tube 6 extends in the horizontal direction above the platform base 5 inside the treatment chamber 3. At portions facing the platform base 5 of the material gas introduction tube 6, a large number of material gas discharge holes 12 aligned along the longitudinal direction of the material gas introduction tube 6 are formed. By discharging a material gas from the material gas discharge holes 12, the material gas is introduced into the treatment chamber 3.

Into the material gas introduction tube 6, for example, a material gas containing at least a carbon-based compound as a component gas is supplied. To the material gas introduction tube 6, a plurality of branched introduction tubes (not illustrated) for guiding component gases from supply sources of the component gases (gas cylinders and containers containing liquids, etc.) into the treatment chamber 3 are connected. In each branched introduction tube, a flow control valve (not illustrated) for adjusting the flow of the component gas from each supply source is provided. In a container containing a liquid among the supply sources, a heating means (not illustrated) for heating the liquid is provided as appropriate.

The exhaust system 7 includes a first exhaust tube 13 and a second exhaust tube 14 that communicate with the treatment chamber 3, a first on-off valve V1, a second on-off valve V2, and a third on-off valve V3, and a first pump 17 and a second pump 18.

In the middle of the first exhaust tube 13, the first on-off valve V1 and the first pump 17 are interposed in this order from the treatment chamber 3 side. As the first pump 17, for example, a low-vacuum pump such as an oil-sealed rotary vacuum pump (rotary pump) or a diaphragm vacuum pump is adopted. The oil-sealed rotary vacuum pump is a positive-displacement vacuum pump that reduces airtight spaces and unavailable spaces among parts such as a rotor, a stator, and a slide blade, by oil. As an oil-sealed rotary vacuum pump that is adopted as the first pump 17, a rotor blade type oil-sealed rotary vacuum pump and a rolling piston type vacuum pump are available.

The tip end of the second exhaust tube 14 is connected between the first on-off valve V1 and the first pump 17 in the first exhaust tube 13. In the middle of the second exhaust tube 14, the second on-off valve V2, the second pump 18, and the third on-off valve V3 are interposed in this order from the treatment chamber 3 side. As the second pump 18, for example, a high-vacuum pump such as a turbo-molecular pump or an oil-diffusion pump is adopted.

Figure 2:
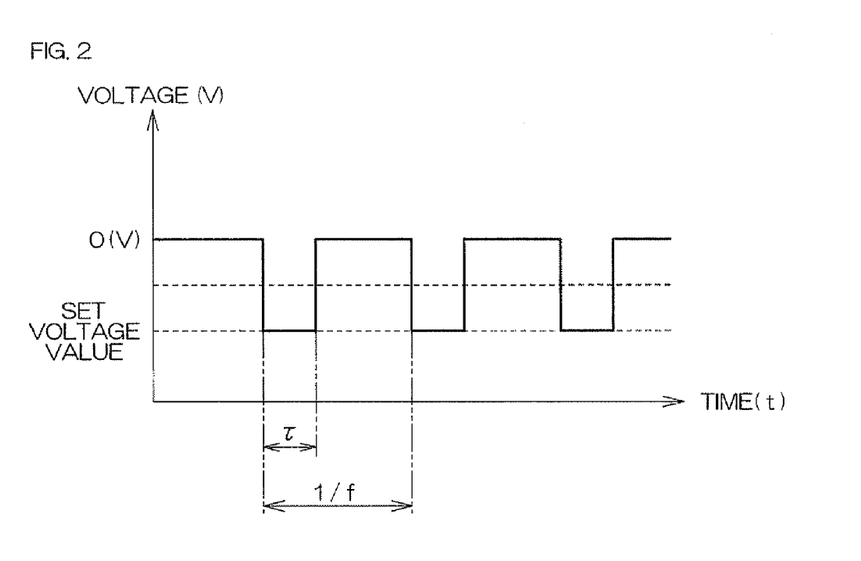
FIG. 2 is a graph showing an example of a waveform of a DC pulse voltage that is applied to the base material from a power supply according to the preferred embodiment of the present invention.

FIG. 2 is a graph showing an example of a waveform of a DC pulse voltage that is applied to the base material 4 from the power supply 8 according to the preferred embodiment of the present invention.

Referring to FIG. 1 and FIG. 2, when the power supply 8 is turned on, a potential difference occurs between the confining wall 2 and the platform base 5. In detail, a negative DC pulse voltage is applied to the base material 4 set on the platform base 5, and the base material 4 functions as a negative terminal. The waveform of the voltage is a pulsed form, so that abnormal discharge does not occur inside the treatment chamber 3 even if a high voltage is applied, and an increase in temperature of the base material 4 is suppressed. The temperature of the base material 4 when the covered member is produced by the plasma CVD apparatus 1 is kept at, for example, 300° C. or lower by setting, for example, the set voltage value, the frequency f, and the duty ratio (duty ratio=pulse width τ×frequency f) of the DC pulse voltage to predetermined values.

Figure 3:
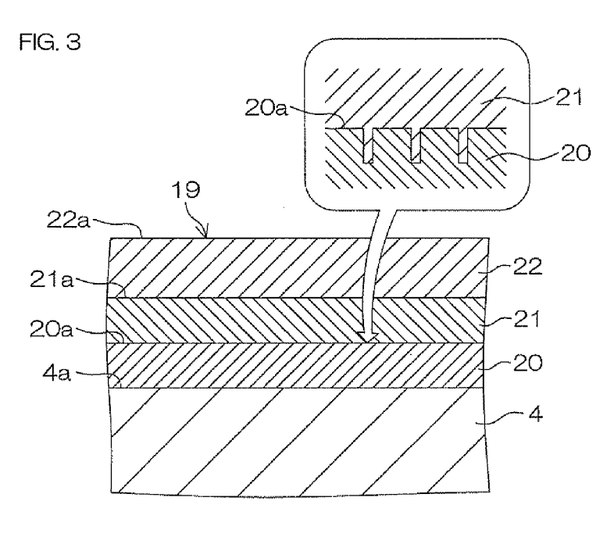
FIG. 3 is a sectional view showing a surface layer portion of the covered member according to the preferred embodiment of the present invention.
Figure 4:
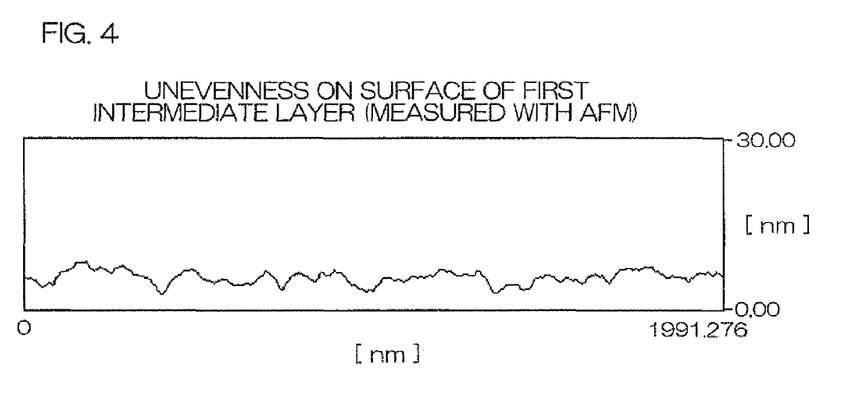
FIG. 4 is a profile showing unevenness of the surface of the first intermediate layer according to the preferred embodiment of the present invention.

FIG. 3 is a sectional view showing a surface layer portion of the covered member 19 according to the preferred embodiment of the present invention. FIG. 4 shows a profile showing unevenness of the surface 20a of the first intermediate layer 20.

Referring to FIG. 3, the covered member 19 is used as, for example, a sliding member or a decorative item. The sliding member is, for example, a clutch plate of a friction clutch, a worm of a steering system (DLC film is formed on the tooth surface), an inner ring and an outer ring of a bearing (DLC film is formed on the raceway surface), a retainer of a bearing, and a propeller shaft (DLC film is formed on the drive shaft, the male spline portion and/or female spline portion).

The covered member 19 includes the base material 4, the first intermediate layer 20 that covers the surface 4a of the base material 4, the second intermediate layer 21 that covers the surface 20a of the first intermediate layer 20, and a DLC film 22 that covers the surface 21a of the second intermediate layer 21. The first intermediate layer 20, the second intermediate layer 21, and the DLC film 22 are thin films with thicknesses of approximately several micrometers to several tens of micrometers. The surface 22a of the DLC film 22 forms at least a portion of the top surface of the covered member 19. When the covered member 19 is used as a sliding member, the surface 22a of the DLC film 22 functions as a sliding surface that slides on a mating member. When the covered member 19 is used as a sliding member, the base material 4 is made of, for example, any of tool steel, carbon steel, and stainless steel.

The first intermediate layer 20 and the second intermediate layer 21 are, for example, metal films of CrN or TiN, etc., or thin films containing Si. The first intermediate layer 20 and the second intermediate layer 21 may have the same composition, or have compositions different from each other. The compositions of the intermediate layers 20 and 21 may be uniform, or may change with the decreasing distance to the DLC film 22 from the base material 4. Specifically, the intermediate layers 20 and 21 may be gradient films whose compositions successively change with the decreasing distance to the DLC film 22, or may be laminated films formed by laminating a plurality of films with compositions different from each other. In the present preferred embodiment, the first intermediate layer 20 and the second intermediate layer 21 are gradient films containing Si.

On the surface 4a of the base material 4, fine unevenness (unevenness in atomic sizes) is formed by collision of ions although this is not illustrated. Accordingly, the surface 4a of the base material 4 is roughened. Therefore, the contact area between the base material 4 and the first intermediate layer 20 is increased. Accordingly, the adhesiveness of the first intermediate layer 20 to the base material 4 is increased. Further, the first intermediate layer 20 partially enters the concave portions formed on the surface 4a of the base material 4, so that by the anchor effect thereof, the adhesiveness of the first intermediate layer 20 to the base material 4 is further increased.

Similarly, as shown in FIG. 3 and FIG. 4, on the surface 20a of the first intermediate layer 20, fine unevenness is formed by collision of ions. The longitudinal axis of the graph shown in FIG. 4 is in units of nanometers. Therefore, on the surface 20a of the first intermediate layer 20, unevenness in atomic sizes is formed. As described later, this unevenness is formed through the roughening step. Thus, the surface 20a of the first intermediate layer 20 is roughened. Therefore, the contact area between the first intermediate layer 20 and the second intermediate layer 21 is increased. Accordingly, the adhesiveness of the second intermediate layer 21 to the first intermediate layer 20 is increased. Further, the second intermediate layer 21 partially enters the concave portions formed on the surface 20a of the first intermediate layer 20, so that by the anchor effect thereof, the adhesiveness of the second intermediate layer 21 to the first intermediate layer 20 is further increased.

Further, the second intermediate layer 21 is laminated along the surface 20a of the first intermediate layer 20, so that fine unevenness (unevenness in atomic sizes) corresponding to the unevenness of the first intermediate layer 20 is formed on the surface 21a of the second intermediate layer 21 although this is not illustrated. Therefore, the contact area between the second intermediate layer 21 and the DLC film 22 is increased. Accordingly, the adhesiveness of the DLC film 22 to the second intermediate layer 21 is increased. Further, the DLC film 22 partially enters the concave portions formed on the surface 21a of the second intermediate layer 21, so that by the anchor effect thereof, the adhesiveness of the DLC film 22 to the second intermediate layer 21 is further increased. Therefore, the adhesiveness of the DLC film 22 to the base material 4 is increased by the roughened surface 4a of the base material 4, the first intermediate layer 20, and the second intermediate layer 21.

Next, with reference to FIG. 1 and FIG. 3, an example of a process for production of the covered member 19 by using the plasma CVD apparatus 1 is described.

To produce the covered member 19 by forming the DLC film 22 on the surface 4a of the base material 4 by using the plasma CVD apparatus 1, first, the base material 4 is set on the support plate 9 of the platform base 5 inside the treatment chamber 3, and then the treatment chamber 3 is closed.

Then, the first pump 17 is driven in a state where the first, second, and third on-off valves V1, V2 and V3 are closed, and thereafter, the inside of the treatment chamber 3 is vacuum evacuated by opening the first on-off valve V1. At the timing at which the inside of the treatment chamber 3 is vacuum evacuated by the first pump 17 to a predetermined degree of vacuum, the first on-off valve V1 is closed, the third on-off valve V3 is opened, and the second pump 18 is driven, and then, by opening the second on-off valve V2, the inside of the treatment chamber 3 is further vacuum evacuated by the first and second pumps 17 and 18.

When the inside of the treatment chamber 3 reaches a predetermined degree of vacuum, the second on-off valve V2 is closed, the second pump 18 is stopped, the third on-off valve V3 is closed, and while evacuation is continued by using only the first pump 17 by opening the first on-off valve V1, the material gas is introduced into the treatment chamber 3 through the material gas introduction tube 6 from a supply source not illustrated. The material gas to be introduced into the treatment chamber 3 at this time is, for example, hydrogen gas and argon gas. Hydrogen gas and argon gas act to stabilize plasma. The material gas is not limited to hydrogen gas and argon gas, and may be only argon gas.

Then, the power supply 8 is turned on to apply a negative DC pulse voltage (for example, −1000V) to the platform base 5. Accordingly, a potential difference occurs between the confining wall 2 and the platform base 5, and plasma is generated inside the treatment chamber 3. Due to this plasma generation, ions and radicals are produced from the material gas inside the treatment chamber 3, and the ions and radicals are hit on the surface 4a of the base material 4 based on the potential difference, and fine unevenness (unevenness in atomic sizes) is formed on the surface 4a of the base material 4 (pretreatment step). By hitting ions and radicals on the surface 4a of the base material 4, foreign elements, etc., adsorbed to the surface 4a of the base material 4 can be removed by sputtering, the surface can be activated, and the atomic arrangement, etc., can be modified (ion bombardment).

When a predetermined treatment time elapses after turning-on of the power supply 8, the power supply 8 is turned off, and further, the supply of the material gas (hydrogen gas and argon gas) into the treatment chamber 3 is stopped. Then, in the state where the inside of the treatment chamber 3 is vacuum evacuated, a material gas is introduced into the treatment chamber 3 from a supply source not illustrated through the material gas introduction tube 6. The material gas to be introduced into the treatment chamber 3 at this time is, for example, a gas containing Si (for example, a mixed gas of $H_2$, TMS (tetramethylsilane gas) ($Si(CH_3)_4$)), and $CH_4$ (methane). While this material gas is introduced into the treatment chamber 3, the power supply 8 is turned on to apply a negative DC pulse voltage to the platform base 5. Accordingly, plasma is generated inside the treatment chamber 3, and the first intermediate layer 20 that covers the surface 4a of the base material 4 is accordingly formed (first intermediate layer formation step).

When a predetermined treatment time elapses after turning-on of the power supply 8, the power supply 8 is turned off. Further, the supply of the material gas (gas containing Si) into the treatment chamber 3 is stopped. Then, in the state where the inside of the treatment chamber 3 is vacuum evacuated, a material gas is introduced into the treatment chamber 3 from a supply source not illustrated through the material gas introduction tube 6. The material gas to be introduced into the treatment chamber 3 at this time is, for example, hydrogen gas and argon gas. The material gas is not limited to hydrogen gas and argon gas, and may be only argon gas.

Then, the power supply 8 is turned on to apply a negative DC pulse voltage, for example, lower than that in the pretreatment step to the platform base 5. In detail, for example, a DC pulse voltage of −1500V is applied to the platform base 5. Accordingly, a potential difference occurs between the confining wall 2 and the platform base 5, and plasma is generated inside the treatment chamber 3. Due to this plasma generation, ions and radicals are produced from the material gas inside the treatment chamber 3, and based on the potential difference, the ions and radicals are hit on the surface 4a of the base material 4 by a force greater than that in the pretreatment step, and fine unevenness (unevenness in atomic sizes) is accordingly formed on the surface 20a of the first intermediate layer 20 (roughening step). Specifically, by applying a negative DC pulse voltage lower than that in the pretreatment step to the platform base 5, unevenness having larger differences in height than in the pretreatment step are formed. Accordingly, the surface 20a of the first intermediate layer 20 is roughened.

When a predetermined treatment time elapses after turning-on of the power supply 8, the power supply 8 is turned off, and further, the supply of the material gas (hydrogen gas and argon gas) into the treatment chamber 3 is stopped. Then, in the state where the inside of the treatment chamber 3 is vacuum evacuated, a material gas is introduced into the treatment chamber 3 from a supply source not illustrated through the material gas introduction tube 6. The material gas to be introduced into the treatment chamber 3 at this time is, for example, a gas containing Si (for example, a mixed gas of TMS and $CH_4$). While this material gas is introduced into the treatment chamber 3, the power supply 8 is turned on to apply a negative DC pulse voltage to the platform base 5. Accordingly, plasma is generated inside the treatment chamber 3, and the second intermediate layer 21 that covers the roughened surface 20a of the first intermediate layer 20 is accordingly formed (second intermediate layer formation step).

For example, in the roughening step, even when ions and radicals penetrate through the first intermediate layer 20 and a portion of the surface 4a of the base material 4 is exposed from the first intermediate layer 20, by forming the second intermediate layer 21, the exposed portion can be covered by the second intermediate layer 21. Accordingly, the surface 4a of the base material 4 is prevented from being directly covered by the DLC film 22. Accordingly, the adhesiveness of the DLC film 22 to the base material 4 is prevented from being deteriorated.

When a predetermined treatment time elapses after turning-on of the power supply 8, the power supply 8 is turned off, and further, the supply of the material gas (hydrogen gas and argon gas) into the treatment chamber 3 is stopped. Then, in the state where the inside of the treatment chamber 3 is vacuum evacuated, a material gas is introduced into the treatment chamber 3 from a supply source not illustrated through the material gas introduction tube 6. The material gas to be introduced into the treatment chamber 3 at this time is, for example, a gas obtained by further adding hydrogen gas and argon gas, etc., to a carbon-based compound. The carbon-based compound is one kind or two or more kinds of hydrocarbon compounds that are gaseous or liquid at a normal temperature under a normal pressure, for example, methane ($CH_4$), acetylene ($C_2H_2$), and benzene ($C_6H_6$), etc.

Then, the power supply 8 is turned on and a potential difference is caused between the confining wall 2 and the platform base 5, and accordingly, plasma is generated inside the treatment chamber 3. Due to this plasma generation, ions and radicals are produced from the material gas inside the treatment chamber 3, and based on the potential difference, the ions and radicals are attracted to the surface 4a of the base material 4. Then, chemical reaction occurs on the surface 4a of the base material 4 and the DLC film 22 is formed (DLC film formation step) Accordingly, the covered member 19 having the base material 4 at least a portion of which is covered by the DLC film 22 is formed.

The adhesiveness (delamination load) of the DLC film 22 of the covered member 19 produced by an example of the process for production of the covered member 19 (covered member 19 according to the preferred embodiment of the present invention) was 13.9 (N). The adhesiveness (delamination load) of the DLC film of the covered member (covered member according to a comparative example) produced without performing the roughening step and the second intermediate layer formation step of the above-described example of the process for production was 10.9 (N). Therefore, by performing the roughening step and the second intermediate layer formation step, the adhesiveness of the DLC film can be improved. Therefore, the reliability and durability of the covered member can be improved.

Further, in the present preferred embodiment, fine unevenness (unevenness in atomic sizes) is formed by making ions collide with the base material 4 and the first intermediate layer 20, so that, for example, even when unevenness is formed on the surface 22a of the DLC film 22 along the unevenness of the surface 21a of the second intermediate layer 21, differences in height of the unevenness are very small.

On the other hand, for example, when shot blasting is applied to the surface 4a of the base material 4, in comparison with the case where ions are made to collide with the surface 4a of the base material 14, unevenness having larger differences in height is formed on the surface 4a of the base material 4. Therefore, when shot blasting is applied, unevenness having larger differences in height may be formed on the surface 22a of the DLC film 22.

When unevenness having larger differences in height is formed on the surface 22a of the DLC film 22 in the case where the covered member 19 is used as a sliding member, the covered member 19 makes an attack on a mating member, and for example, the mating member may be shaved off or the mating member may be worn away early. Therefore, as in the present preferred embodiment, by forming unevenness by collision of ions, an increase in attacking properties of the covered member 19 can be suppressed.

The "delamination load" described above is a measured value (measured value of mode 2) when the DLC film is locally delaminated by a scratch test regulated in the Japan Society of Mechanical Engineers standards JSME S010 (1996).

A preferred embodiment of the present invention was described above, however, the present invention is not limited to the contents of the above-described preferred embodiment, but can be variously changed within the scope described in the claims. For example, in the above-described preferred embodiment, a case where the DLC film 22 covers the base material 4 is described, however, the DLC film 22 containing Si may cover the base material 4.

In the above-described embodiment, the case where the first intermediate layer 20, the second intermediate layer 21, and the DLC film 22 are formed by a DC pulse plasma CVD method, is described, however, the first intermediate layer 20, the second intermediate layer 21, and the DLC film 22 may be formed by a DC pulse plasma CVD method, or may be formed by a method other than the plasma CVD method. However, the first intermediate layer 20, the second intermediate layer 21, and the DLC film 22 are preferably formed by the DC pulse plasma CVD method because an increase in temperature of the base material 4 can be suppressed.

According to the DC pulse plasma CVD method, by adjusting the set voltage value, the frequency f, and the duty ratio of the DC pulse voltage, the time of hitting ions and radicals on the surface 4a of the base material 4 and the surface 20a of the first intermediate layer 20 can be changed in the above-described pretreatment step and the roughening step. Accordingly, unevenness on the surface 4a of the base material 4 and unevenness on the surface 20a of the first intermediate layer 20 can be adjusted.

On the other hand, in the DC pulse plasma CVD method, a DC voltage is continuously applied to the base material 4, so that unlike the DC pulse plasma CVD method, unevenness on the surface 4a of the base material 4 and unevenness on the surface 20a of the first intermediate layer 20 cannot be adjusted. Therefore, it is difficult to form desired unevenness on the surface 4a of the base material 4 and the surface 20a of the first intermediate layer 20. Therefore, the DC pulse plasma CVD method is preferably adopted because unevenness can be adjusted.

In the above-described preferred embodiment, the case where the second intermediate layer 21 is formed between the first intermediate layer 20 and the DLC film 22 is described, however, it is also possible that the second intermediate layer 21 is omitted and the surface 20a of the first intermediate layer 20 is directly covered by the DLC film 22.

In addition, in the above-described preferred embodiment, the case where the surface 4a of the base material 4 and the surface 20a of the first intermediate layer 20 are roughened is described, however, the surface 4a of the base material 4 does not necessarily have to be roughened. It is also possible that by the same method as that for these surfaces 4a and 20a (by collision of ions), the surface 21a of the second intermediate layer 21 is roughened. In this case, the contact area between the second intermediate layer 21 and the DLC film 22 is increased, so that the adhesiveness of the DLC film 22 to the second intermediate layer 21 is increased. Further, the DLC film 22 partially enters the concave portions formed on the surface 21a of the second intermediate layer 21, so that by the anchor effect thereof, the adhesiveness of the DLC film 22 to the second intermediate layer 21 is further increased. Therefore, the adhesiveness of the DLC film 22 to the base material 4 is further increased.

The present invention is described in detail above based on the detailed embodiments, however, a person skilled in the art who understands the description given above will easily conceive of modifications, alterations, and equivalents thereof. Therefore, the present invention should cover the scope of the claims and the scope of equivalents thereof.

The present application corresponds to Japanese Patent Application No. 2010-124553 filed in Japan Patent Office on May 31, 2010, the entire disclosure of which is incorporated herein by reference.

DESCRIPTION OF REFERENCE SYMBOLS

4: Base material, 4a: Surface of base material, 19: Covered member, 20: First intermediate layer, 20a: Surface of first intermediate layer, 21: Second intermediate layer, 21a: Surface of second intermediate layer, 22: DLC film

What is claimed is:

1. A process for production of a covered member having a base material at least a portion of which is covered by a DLC film, comprising:
   a first intermediate layer formation step which forms a first intermediate layer by a DC pulse plasma CVD method that covers a surface of the base material while keeping a temperature of the base material at 300° C. or lower;
   a roughening step which roughens a surface of the first intermediate layer by making ions collide with the surface of the first intermediate layer while keeping the temperature of the base material at 300° C. or lower; and
   a DLC film formation step which forms a DLC film by a DC pulse plasma CVD method that covers the roughened surface of the first intermediate layer while keeping the temperature of the base material at 300° C. or lower.

2. The process for production of the covered member according to claim 1, further comprising: a pretreatment step which roughens the surface of the base material by making ions collide with the surface of the base material while keeping the temperature of the base material at 300° C. or lower before the first intermediate layer is formed.

3. The process for production of the covered member according to claim 1, further comprising:
- a second intermediate layer formation step which forms a second intermediate layer by a DC pulse plasma CVD method that covers the surface of the first intermediate layer while keeping the temperature of the base material at 300° C. or lower before the DLC film is formed, wherein
- the DLC film formation step includes a step of forming a DLC film that covers a surface of the second intermediate layer while keeping the temperature of the base material at 300° C. or lower.

4. A covered member having a base material at least a portion of which is covered by a DLC film, comprising:
- a base material;
- a first intermediate layer that has a roughened surface and covers the base material; and
- a DLC film that covers the surface of the first intermediate layer, wherein
- the first intermediate layer and the DLC film are formed by a DC pulse plasma CVD method in a state where a temperature of the base material is kept at 300° C. or lower, and
- the surface of the first intermediate layer is roughened by collision of ions.

5. The covered member according to claim 4, wherein the base material has a surface that is roughened by collision of ions and covered by the first intermediate layer.

6. The covered member according to claim 4, further comprising: a second intermediate layer formed by a DC pulse plasma CVD method that has a surface covered by the DLC film, and covers the surface of the first intermediate layer.

* * * * *